United States Patent [19]

Tsuda

[11] 4,171,512
[45] Oct. 16, 1979

[54] CIRCUIT FOR PREVENTING BREAKDOWN OF A LOAD RESULTING FROM WRONG CONNECTION OF A POWER SOURCE

[75] Inventor: Shin Tsuda, Kawagoe, Japan

[73] Assignee: Canon Kabushiki Kaisha, Tokyo, Japan

[21] Appl. No.: 849,392

[22] Filed: Nov. 7, 1977

Related U.S. Application Data

[63] Continuation of Ser. No. 665,180, Mar. 9, 1976, abandoned.

[30] Foreign Application Priority Data

Mar. 14, 1975 [JP] Japan ............................ 50-30707

[51] Int. Cl.$^2$ .................... G01R 19/16; G01R 1/36; H02H 9/00
[52] U.S. Cl. ............................ 324/133; 307/253; 320/25; 324/110; 361/1
[58] Field of Search ............ 324/133, 110; 320/25, 320/26; 361/1; 307/253; 429/1

[56] References Cited

U.S. PATENT DOCUMENTS

| | | | |
|---|---|---|---|
| 2,921,264 | 1/1960 | Sundt | 324/110 |
| 3,023,326 | 2/1962 | Cone | 324/110 X |
| 3,446,988 | 5/1969 | Ogawa | 307/253 X |

*Primary Examiner*—Gerard R. Strecker
*Attorney, Agent, or Firm*—Fitzpatrick, Cella, Harper & Scinto

[57] ABSTRACT

In a circuit for preventing breakdown of a load resulting from a wrong connection of a power source, there are provided a first load to which a DC voltage source should be applied at a predetermined polarity and to which a wrong polarity connection of the DC voltage source should be prevented, a second load to which the DC voltage should be applied, and a transistor having the base thereof connected to the second load and the collector thereof connected to one terminal for connection with the DC voltage source. The first load is connected between the base electrode and emitter electrode of the transistor. The junction of the first and second loads is connected to another terminal for connection to the DC voltage source.

7 Claims, 7 Drawing Figures

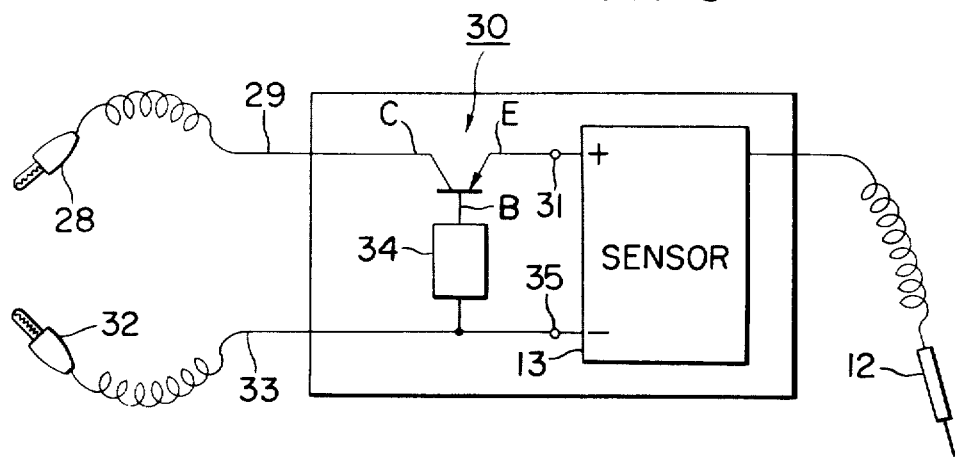
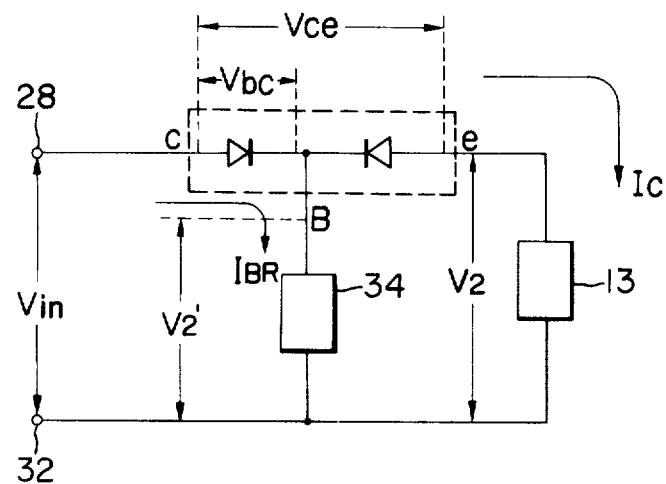
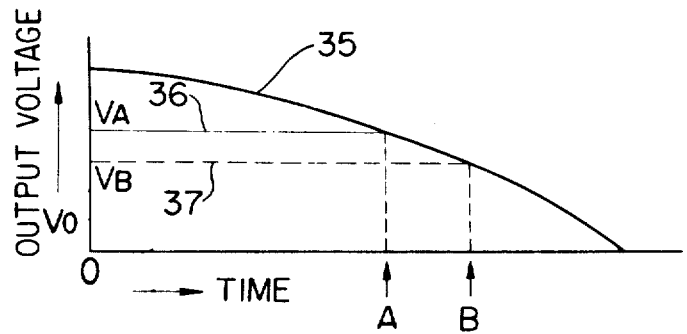

CIRCUIT FOR PREVENTING BREAKDOWN OF A LOAD RESULTING FROM WRONG CONNECTION OF A POWER SOURCE

This is a continuation of application Ser. No. 665,180 filed Mar. 9, 1976, now abandoned.

BACKGROUND OF THE INVENTION

1. Field of the Invention

This invention relates to a breakdown preventing circuit for preventing a load from being broken down by a reverse bias when the load is connected to a power source with its positive and negative terminals confused.

2. Description of the Prior Art

In electronic equipments adapted for connection with external power sources or adapted to accommodate therewithin internal power sources such as electric cells or the like, it is desirable to provide a breakdown preventing circuit for preventing the breakdown of the electronic equipment (particularly, the breakdown of semiconductor elements or the like employed in the electronic equipment) when the power source is connected at the opposite polarity to the prescribed polarity for the electronic equipment, and more particularly, for preventing the reverse voltage from being applied to the semiconductor elements forming the electronic equipment when such reverse voltage has been applied to the electronic equipment.

FIG. 1 of the accompanying drawings shows an example of such electronic equipment, in which reference numeral 11 designates a logic tester having a probe 12 for contacting any desired point on a digital device 15 and a sensor circuit 13 comprising TTLICs (Transistor Transistor-Logic Integrated Circuits) for detecting whether the point contacted by the probe is at a level corresponding to logic "0" or at a level corresponding to logic "1", thereafter converting the detection signal into light or sound which provides an alarm. Such logic tester has no power source accommodated therewithin, but it is supplied with power in such a manner that conductive clips 19 and 20, attached to the tester, may be clamped onto lines 17 and 18 through which the voltage of a power source 16 contained within the digital device 15 may be supplied to a digital circuit 14 to be tested.

In such logic tester 11, there may occur a risk of the power introducing clips 19 and 20 being connected to the lines 17 and 18 with the polarities of the two clips confused by mistake, and such wrong connection would result in breakdown of the transistors forming the ICs within the sensor circuit 13.

To avoid such breakdown, a diode 23 may be connected to the line 21, as heretofore usually employed for the wrong connection preventing means with electronic equipments. Such diode 23, as seen in FIG. 1, ensures the source voltage to be properly applied to the sensor circuit 13 when the power source is properly connected to the clips 19 and 20, and it prevents the voltages of wrong polarities from being applied to the sensor circuit 13 whenever the power source 16 is connected at wrong polarities, namely, the clip 19 is connected to the line 18 while the clip 20 is connected to the line 17.

Such use of the diode prevents the breakdown of the semiconductor elements, which would otherwise result from wrong connection, by a very simple arrangement. However, when voltages of proper polarities are applied to the sensor circuit 13 which is a load, the forward voltage drop in the diode 23 will be 0.7V or more if it is a silicon diode, and 0.4V or more even if it is a germanium diode. For example, if a digital device using a TTLIC which interfaces the power source is connected to a logic tester also using a TTLIC which forms the load, the tolerance of a TTLIC for the power source fluctuation is 5 to 10% of the source voltage. More specifically, the tolerance is 5.25 (5.5) V to 4.75 (4.5) V, since the source voltage of a TTLIC is 5V. Therefore, in the case as shown in FIG. 1 wherein the silicon diode 23 is added to prevent the breakdown resulting from a wrong connection, the voltage drop of the diode causes the voltage supplied to the load or the sensor circuit 13 to drop to 4.3V or less and this leads to a disadvantage that no TTLIC can be used in the load 13.

To prevent the breakdown from occurring where the voltage drop is small and a wrong connection is made, use may also be made of such a circuit as shown in FIG. 2. Therein, reference numeral 24 designates a transistor (TOSHIBA product, 2SB434), of which the emitter is connected to a clip 25 which should be connected to the positive terminal of the power source, the collector is connected to a sensor circuit 13 which is a load, and the base is connected through a resistor 26 to the sensor circuit 13 and to a clip 27 which should be connected to the negative terminal of the power source. In FIG. 2, reference numerals similar to those in FIG. 1 designate similar members, and it is to be understood that the circuit of FIG. 2 is applied to the digital device 15 as in FIG. 1.

Operation A, this circuit will now be described. When a forward voltage is applied to the base of the transistor 24 to cause a certain quantity of base current $I_B$ say, 600 $\mu A$, to flow, the transistor 24 conducts to supply the voltage to the load 13. Assuming that a current of 30 mA is applied to the load 13, the voltage drop in the transistor 24 will be the saturated collector-emitter voltage $V_{C(ES)}$ of the transistor 24 as shown in FIG. 5 and this voltage drop will become smaller to some extent, say, about 0.15V, if the transistor is the aforementioned 2SB434 (in most transistors, such saturated voltage is 0.2V or less). However, it is of course preferable that such voltage drop be further smaller. In FIG. 5, the dotted curves are the characteristic curves illustrating the relationship between the collector-emitter voltages of the FIG. 2 transistor 24 (2SB434) with its base current prescribed as 600 $\mu A$, 500 $\mu A$, 400 $\mu A$, 300 $\mu A$, 200 $\mu A$ and 100 $\mu A$ and the current conducted to the load 13. Nevertheless, should the clips 25 and 27 be reverse-connected to the lines 17 and 18, the transistor 24 whose emitter-base withstanding voltage is aslow as 5V (in most transistors, such withstand voltage is about 4 to about 6V) will breakdown to apply a reverse voltage to the load 13 if the voltage of the power source 16 is higher than the withstanding voltage of the transistor.

SUMMARY OF THE INVENTION

It is therefore an object of the present invention to provide a circuit for preventing breakdown resulting from a wrong connection of the power source which has a further smaller voltage drop than in the conventional circuit of this type.

It is another object of the present invention to provide such a circuit which has a higher reverse withstanding voltage.

It is still another object of the present invention to provide such a circuit which enables a power source such as electric cells or the like to enjoy an extended service time.

Other objects and features of the present invention will become more fully apparent from the following detailed description of the invention taken in conjunction with the accompanying drawings.

BRIEF DESCRIPTION OF THE DRAWINGS

FIG. 3 is a circuit diagram showing the inventive circuit for preventing breakdown resulting from a wrong connection.

FIG. 4 diagrammatically shows the equivalent circuit for the circuit of FIG. 3.

FIG. 6 is a graph for illustrating the length of service time of the electric cell.

DESCRIPTION OF THE PREFERRED EMBODIMENTS

Figure 1:
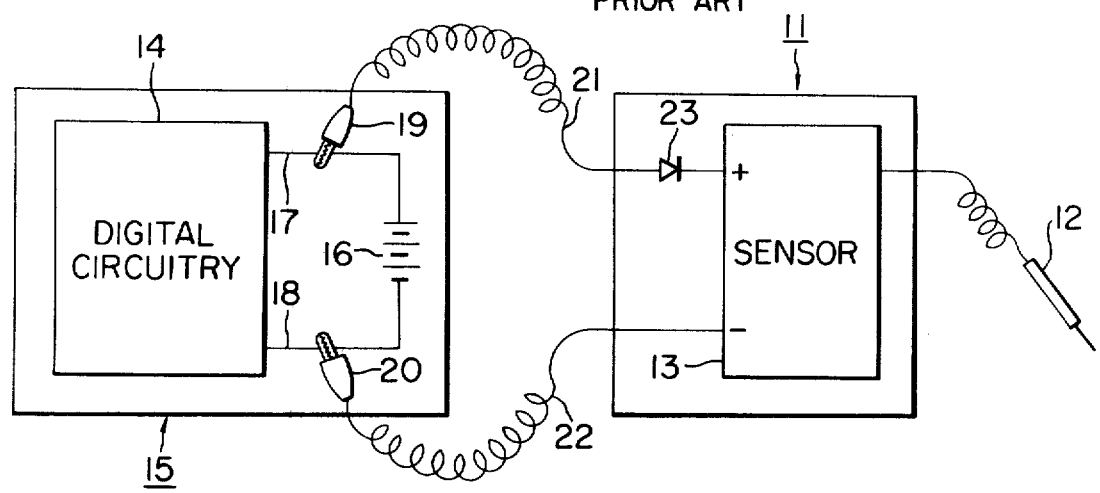
FIGS. 1 and 2 are circuit diagrams showing examples of the prior art circuit for preventing breakdown resulting from a wrong connection.

Referring to FIG. 3, there is shown an inventive circuit for preventing breakdown resulting from a wrong connection of a power source. In this circuit, a clip 28 for conducting the positive voltage is connected through a line 29 to the collector C of a transistor 30, and the emitter electrode E of the transistor 30 is connected to a terminal 31 for applying the positive voltage to a first load which comprises a sensor circuit 13. A clip 32 for conducting the negative voltage is connected through a line 33 to a terminal 35 for applying the negative voltage to the first load which is the sensor circuit 13, and a second load 34 is connected between the base B of the transistor 30 and the line 33. In FIG. 3, the reference numerals are similar in significance to those in FIG. 1, and the circuit of FIG. 3 is applied to the digital device 15 of FIG. 1 in the same manner as that shown in FIG. 1.

In the arrangement of FIG. 3, the base-emitter junction and the base-collector junction of the transistor 30 may respectively be considered to form diodes and thus, there is provided an equivalent circuit as shown in FIG. 4. If the source voltage is Vin, the base-collector voltage is Vbc, the collector-emitter voltage is Vce, the voltage applied across the load 34 is $V_2'$, and the voltage applied across the load 13 is $V_2$, then the voltages at the respective parts will be:

$$V_2' = Vin - Vbc$$

$$V_2 = Vin - Vce$$

As shown, the base-collector voltage Vbc is about 0.7V, being equal to the voltage drop in the diode.

Figure 2:
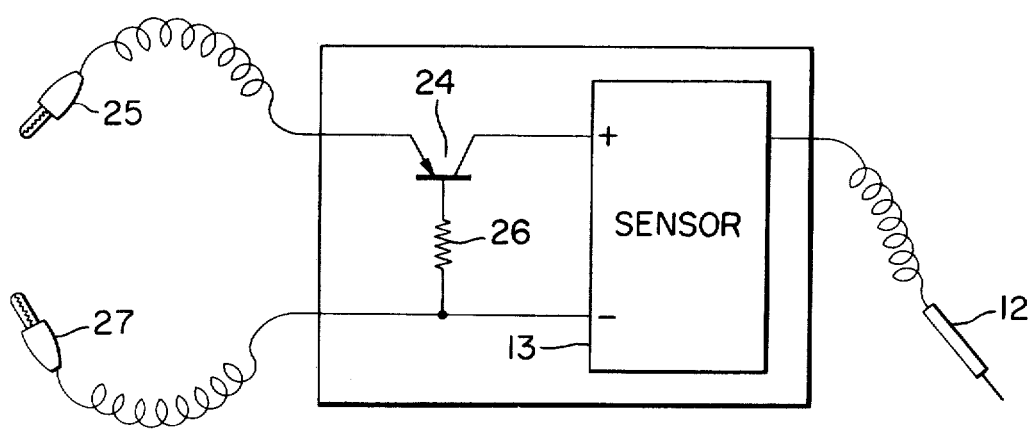

Operation of this circuit will now be discussed. When the voltage Vin is applied between the power source connection terminals 28 and 32 of the circuit, a current $I_{BR}$ flows through the collector-base of the transistor 30 to the load 34. When this occurs, the collector-base junction of the transistor is in the forward direction. Also, the flow of the current $I_{BR}$ causes a current $I_C$, which is $\beta'$ times (two to ten times) the current $I_{BR}$ to flow through the collector C and emitter E of the transistor 30 and through the load 13. In this case, the collector-emitter voltage drop $V_{CES2}$ is determined by the base current and the current conducted to the load 13 and, if the transistor 30 is the aforementioned 2SB434 and for example, if the base current is 10 mA and the current conducted to the load 13 is 30 mA as in the case of FIG. 2, then the voltage drop $V_{CES2}$ will be about 0.07V which is apparently smaller than said $V_{CES1}$.

Figure 5:
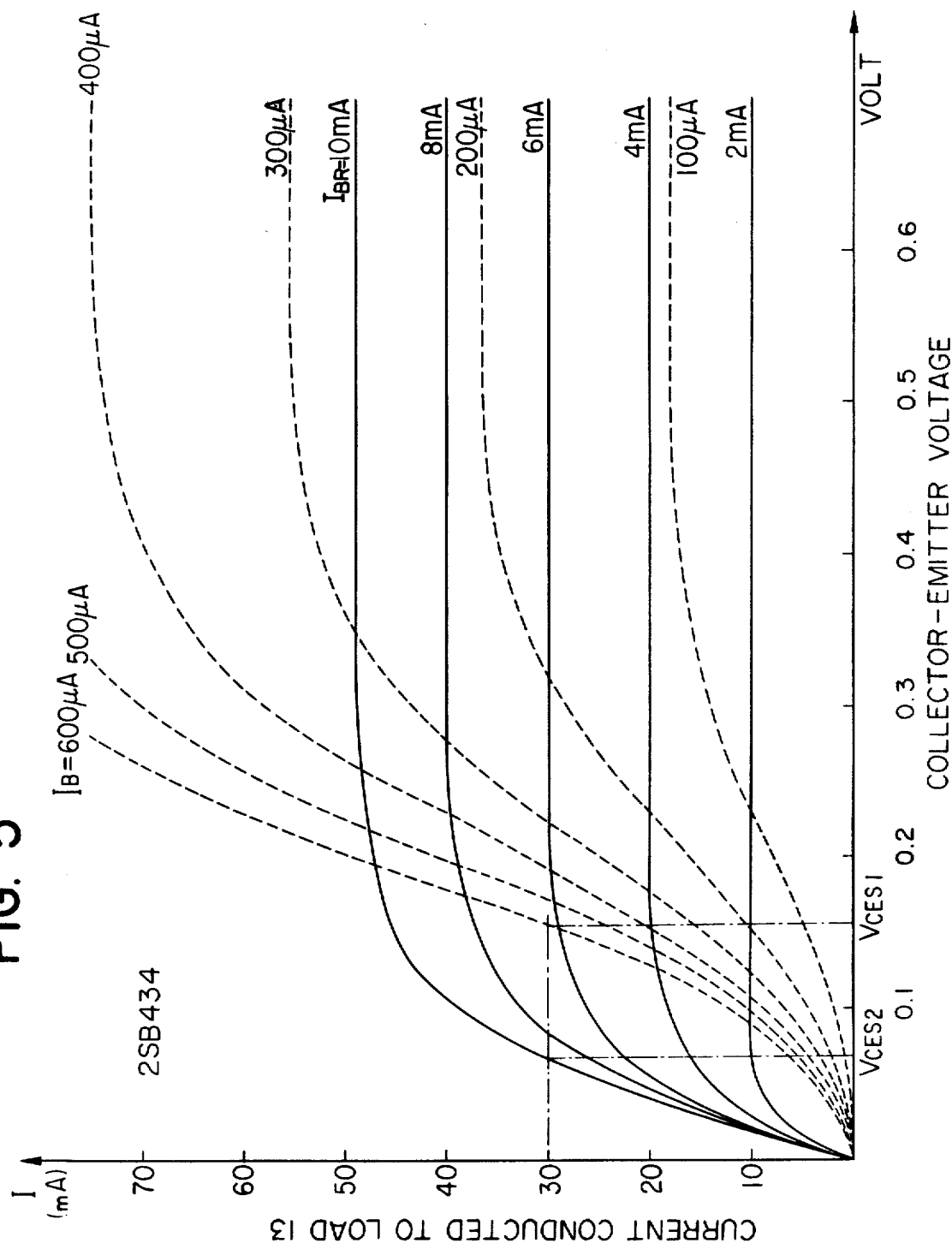
FIG. 5 is a graph illustrating the characteristics of the voltage conducted to the load and the collecter-emitter voltages in FIGS. 2 and 3.

The characteristic curves indicated by solid lines in FIG. 5 illustrate the relationships between the collector-emitter voltages and the currents conducted to the load 13 when the base current $I_{BR}$ of the transistor 30 in FIG. 3 is prescribed as 10 mA, 8 mA, 6 mA, 4 mA and 2 mA, respectively.

It will thus be seen that the arrangement as shown in FIG. 3 ensures the source voltage to be supplied to the load 13 only with a slight voltage drop involved when the power source is connected in the forward direction.

In the breakdown preventing circuit, the transistor 30 must be used under its saturated condition and thus, the values of the first and the second load must be set so that the base current and the current conducted to the load 13 may be such that the rising portions of the characteristic curves indicated by solid lines in FIG. 5 (the non-flat portions of the curves in the graph) are used.

Whenever the positive and negative terminals of the power source are reverse-connected to the clips 28 and 32, the reverse withstand voltages between the collector and the base and between the collector and the emitter, of the transistor 30, are sufficiently high, say, 50V (in the ordinary transistors, such withstand voltages are also sufficiently high, say, 30 to 150V), and the transistor 30 will never break down for any lower voltage of the power source 16, as a result of which no current may flow to the loads 13 and 34 and the application of the reverse withstanding voltage to these loads may be prevented.

In the breakdown preventing circuit according to the embodiment of the present invention shown in FIG. 3, the collector-emitter voltage drop Vce is of the order of 0.1V at the greatest and the collector-base voltage drop Vcb is about 0.7V at the greatest, and this leads to an advantage that where an electric cell is employed as the power source, the service life thereof is longer by 10 to 20% than in the conventional breakdown preventing circuit utilizing the ordinary diode as shown in FIG. 1. This will be described by reference to FIG. 6. FIG. 6 illustrates the relationship between the electromotive force and the lapse of service time of the cell which comprises an alkaline manganese cell, for example. Curve 35 represents the electromotive force characteristic of the cell, wherein the straight solid line 36 represents the necessary voltage $V_A$ to be supplied between the clips 19 and 20 in FIG. 1, and the broken line represents the necessary voltage $V_B$ to be supplied between the clips 28 and 32. Now, if a voltage of 4V must be applied across the load 13 in FIGS. 1 and 3, a voltage $V_A = 4.7V$ must be supplied between the clips 19 and 20 in FIG. 1 because there is a voltage drop of 0.7V resulting from the diode 23. On the other hand, in FIG. 3, a voltage $V_B = 4.1V$ need only be supplied between the clips 19 and 20 because the collector-emitter voltage drop of the transistor 30 is about 0.1V at the maximum. Thus, as will be apparent also from FIG. 6, where the circuit of FIG. 1 is used, the cell can only be used until the point of intersection is reached between the curve 35 and the straight line 36, namely, the point A on the abscissa representing the lapse of service time of the cell, whereas when the circuit of FIG. 3 according to the present invention is employed, the cell can be used until a farther point B is reached, and this is highly effective to increase the service time of the cell. Since, in the embodiment of the present invention shown in FIG. 3, the collector-emitter voltage drop is 0.2V while the collector-base voltage drop is about 0.7V and thus, the voltage applied to the load 34 is necessarily smaller than the voltage applied to the load 13. This permits the load 34 to employ circuit elements operable at a lower voltage than in the load 13.

Figure 7:
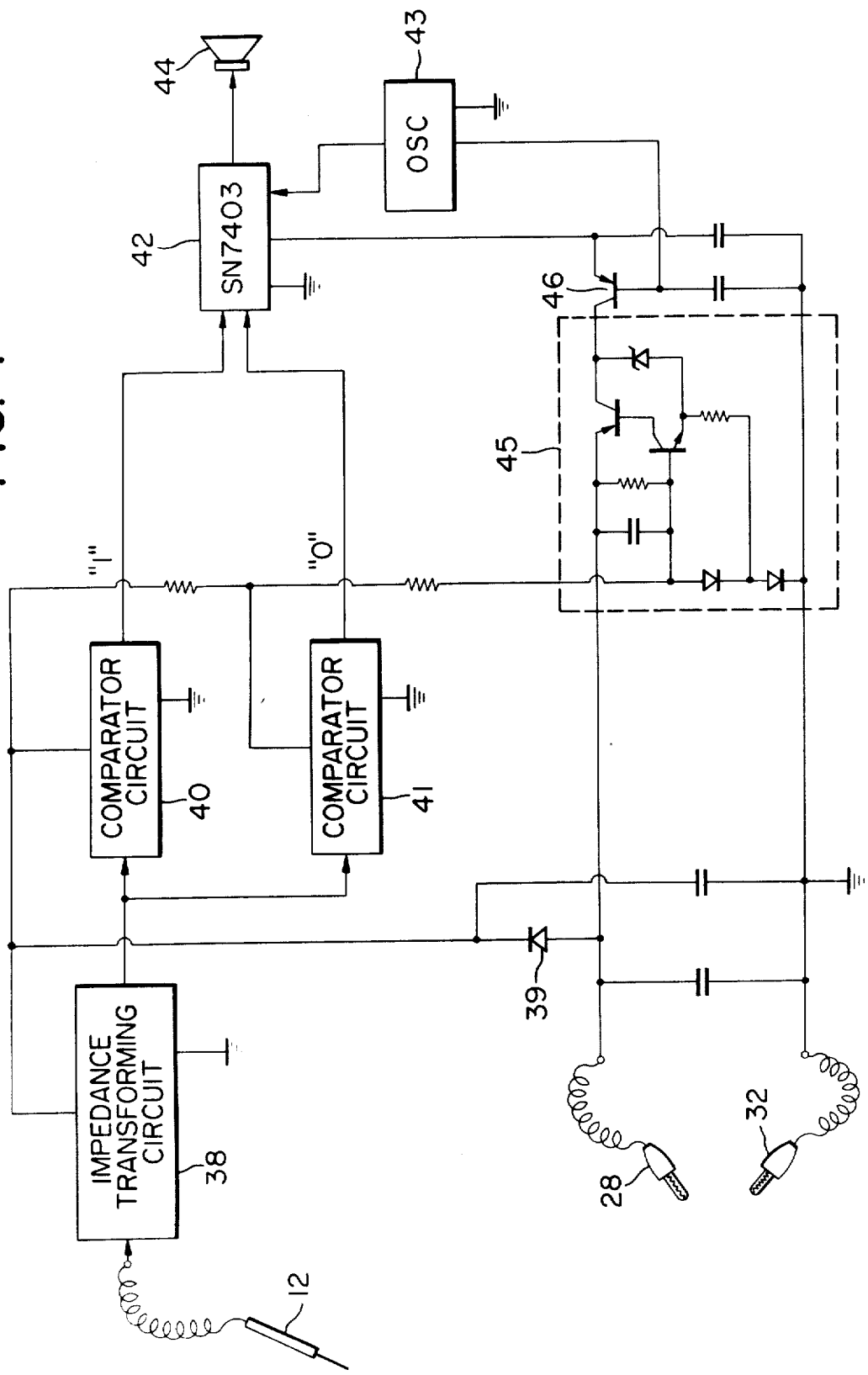
FIG. 7 is a diagram of a circuit of the present invention applied to a logic tester.

FIG. 7 more particularly shows the logic tester to which the present invention is applied. This logic tester is to be used with a voltage source 16 of 5-15V in the digital device 15 shown in FIG. 1. The signal introduced through the probe 12 passes through an impedance transforming circuit 38, whereafter the signal is applied to a comparator circuit 40 which compares the signal with the positive voltage introduced from the source 16 through the clip 28 to thereby determine whether or not the former signal is at the level of logic "1" (voltage drop has already occurred due to the diode 39). Whenever the applied signal is "1", the comparator circuit 40 produces a predetermined output. Designated by 41 is a comparator circuit which compares the said signal with the positive voltage introduced from the source 16 through the clip 28 to thereby determine whether or not the signal is at the level of logic "0" (voltage drop has already occurred due to the diode 39). A part of the aforesaid signal is applied to the latter comparator circuit 41 which produces a predetermined output whenever the signal is at the level of logic "0".

Since these comparator circuits 40 and 41, as already described, are designed for use with a digital device having a source voltage of 5-15V, they compare the source voltage of the digital device 15 and the level of the applied signal to thereby determine whether the latter is "0" or "1", and produce a signal at a predetermined level corresponding to the logic "0" or "1".

The outputs of such comparator circuits 40 and 41 are applied to a logic circuit 42 which comprises a TTLIC (SN7403 produced by T.I., Inc.) including NOR and NAND gates therein. After the two outputs are applied to the NOR gate, the output of this NOR gate is applied to one input terminal of the NAND gate while the output of an oscillator circuit 43 oscillating at audio-frequency is applied to the other input terminal of the NAND gate.

Thus, at the output terminal of the logic circuit 42, the output of the oscillator circuit 43 does not appear when the output of the NOR gate is "1", but the output of the oscillator circuit appears when the output of the NOR gate is "0". Therefore, if a signal of logic "1" is introduced by the probe 12, a speaker 44 will produce no sound upon application of the logic circuit output to the speaker 44, whereas if a signal of logic "0" is introduced, the speaker 44 will produce a sound corresponding to the oscillator frequency in the oscillator circuit.

A predetermined source voltage is applied to the logic circuit 42 and the oscillator circuit 43 and application of such voltage is effected through the breakdown preventing circuit of the present invention. More specifically, the voltages introduced through the clips 28 and 32 are made into a constant voltage by a well-known constant voltage circuit 45, and then applied to the transistor 46 according to the present invention.

The logic circuit 42 as a load is connected to the emitter of the transistor 46 and the oscillator circuit 43 as a load is connected to the base of the transistor.

The logic tester shown in FIG. 7, like that shown in FIG. 1, is also applicable to the digital device 15.

In the foregoing embodiment, the breakdown preventing circuit of the present invention has been shown as applied to a logic tester, whereas it will be apparent that the invention is not restricted to the application to such device but is equally applicable to any electronic equipment which will require prevention of a wrong connection of the power source.

What is claimed is:

1. A circuit for preventing breakdown of a load resulting from a wrong connection of a power source, comprising:
   a first load to which a DC voltage source should be applied at a predetermined polarity and to which a reverse-polarity connection of the DC voltage source should be prevented, wherein the DC voltage applied to the first load is a regulated voltage;
   a second load the output of which controls said first load, wherein the DC voltage applied to the second load is not required to be regulated;
   a transistor having the base electrode thereof connected to one side of said second load, one electrode of said transistor other than said base electrode being connected to one terminal for connection with said DC voltage source, said first load being connected between the other side of said second load and the other transistor electrode, wherein said other electrode has a lower reverse-withstanding voltage than the reverse-withstanding voltage of the junction between said base electrode and said one electrode, wherein said first and second loads are set to permit a current flow which operates said transistor in its saturation range; and
   means for connecting said other side of said second load to another terminal for connection to said DC voltage source.

2. A circuit according to claim 1, wherein said transistor is a PNP transistor, said one electrode is the collector electrode and said other electrode is the emitter electrode.

3. A circuit according to claim 1, wherein the DC voltage to be applied to said first load is higher than that to be applied to said second load.

4. A circuit according to claim 1, wherein said first load includes logic circuitry and wherein said second load is an oscillator circuit.

5. A circuit according to claim 4, further comprising voltage regulating means, wherein said DC voltage source is coupled to said transistor and loads through said regulating means.

6. A circuit according to claim 4, further comprising electro-acoustic conversion means coupled to the oscillating output of said oscillator circuit.

7. A circuit according to claim 4, further comprising means for determining whether the voltage of a circuit under test is a logical "0" or "1" for producing respective output signals corresponding thereto, and means for applying said determining means output signals to said logic circuitry.

* * * * *